United States Patent
Yoshiga (10) Patent No.: US 9,806,197 B1
(45) Date of Patent: Oct. 31, 2017

(54) DISPLAY DEVICE HAVING BACK GATE ELECTRODES

(71) Applicant: Innolux Corporation, Miao-Li County (TW)

(72) Inventor: Masahiro Yoshiga, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/208,610

(22) Filed: Jul. 13, 2016

(51) Int. Cl.
*H01L 29/786* (2006.01)
*H01L 29/66* (2006.01)
*H01L 27/12* (2006.01)

(52) U.S. Cl.
CPC .... *H01L 29/78648* (2013.01); *H01L 27/1222* (2013.01); *H01L 27/1225* (2013.01); *H01L 27/1255* (2013.01); *H01L 29/7869* (2013.01); *H01L 29/78663* (2013.01); *H01L 29/78672* (2013.01)

(58) Field of Classification Search
CPC ......... G09G 2320/0295; G09G 3/3233; G09G 2330/021; G09G 2320/0626

USPC ................................ 257/59; 345/76, 77, 690
See application file for complete search history.

(56) References Cited

U.S. PATENT DOCUMENTS

| | | | |
|---|---|---|---|
| 7,414,600 B2 | 8/2008 | Nathan et al. | |
| 2008/0035927 A1* | 2/2008 | Yamazaki | H01L 27/1255 257/59 |
| 2010/0053041 A1 | 3/2010 | Abe et al. | |
| 2011/0122325 A1 | 5/2011 | Yamashita et al. | |
| 2011/0156025 A1 | 6/2011 | Shionoiri et al. | |
| 2012/0086697 A1 | 4/2012 | Hasegawa et al. | |
| 2015/0187276 A1* | 7/2015 | Shim | G09G 3/3233 345/77 |
| 2015/0356924 A1* | 12/2015 | Chen | G09G 3/3233 345/690 |

\* cited by examiner

*Primary Examiner* — Evan Pert
*Assistant Examiner* — Changhyun Yi
(74) *Attorney, Agent, or Firm* — JCIPRNET (57) ABSTRACT

A display device including a substrate, a first gate electrode, a second gate electrode, an active layer, and a first data electrode is provided. The active layer is disposed between the first gate electrode and the second gate electrode. And one of the first gate electrode and the second gate electrode is connected to the data line, so as to reduce the off leak current.

9 Claims, 7 Drawing Sheets

DISPLAY DEVICE HAVING BACK GATE ELECTRODES

BACKGROUND OF THE INVENTION

1. Field of the Invention

The invention generally relates to a display device, in particular, to a display device capable of reducing an off leak current.

2. Description of Related Art

For a display panel, an off leak current of a display device therein is an important issue. A larger off leak current would significantly affect power consumption and display quality of the display panel. In a related art that the display device includes a double gate thin film transistor, a constant voltage is applied to additional back gate electrodes via an individual signal line. The individual signal line is prepared to apply the constant voltage signal for the back gate electrode to modulate gate voltage applying to the channel of thin film transistor. In thin film transistor back gate voltage modulating, the decrease of threshold voltage causes the increase of off leak current, and vice versa. An optimal condition between threshold voltage and off leak current is limited.

Hence, how to manufacture a display device that has low power consumption and satisfactory display quality without increasing circuit complexity is one of the most important topics in the pertinent field.

SUMMARY OF THE INVENTION

Accordingly, the invention is directed to a display device capable of reducing an off leak current.

An embodiment of the invention provides a display device including a substrate, a first gate electrode, a second gate electrode, an active layer, and a first data electrode. The first gate electrode is disposed on the substrate. The second gate electrode is disposed between the first gate electrode and the substrate. The active layer is disposed between the first gate electrode and the second gate electrode. The active layer is overlapped with the first gate electrode and the second gate electrode. The first data electrode is disposed on the substrate and connected to the active layer. One of the first gate electrode and the second gate electrode is connected to the first data electrode.

In an exemplary embodiment of the invention, the second gate electrode is connected to the first data electrode. The first gate electrode is electrically isolated to the second gate electrode and the first data electrode.

Based on the above, in embodiments of the invention, the display device includes double gate electrodes. One of the first gate electrode and the second gate electrode is connected to the data line, so as to reduce the off leak current.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the embodiments of the invention, examples of which are illustrated in the accompanying drawings. Wherever possible, the same reference numbers are used in the drawings and the description to refer to the same or like parts.

The following will describe some embodiments as examples of the invention. However, it should be noted that the invention is not limited to the disclosed embodiments. Moreover, some embodiments may be combined where appropriate. The term "couple" used throughout this specification (including the claims) may refer to any direct or indirect connection means. For example, if it is described that the first device is coupled to the second device, it should be understood that the first device may be directly connected to the second device or indirectly connected to the second device through other devices or certain connection means. In addition, the term "signal" may stand for at least one current, voltage, electric charge, temperature, data, electromagnetic wave, or any other signal or signals.

Figure 1:
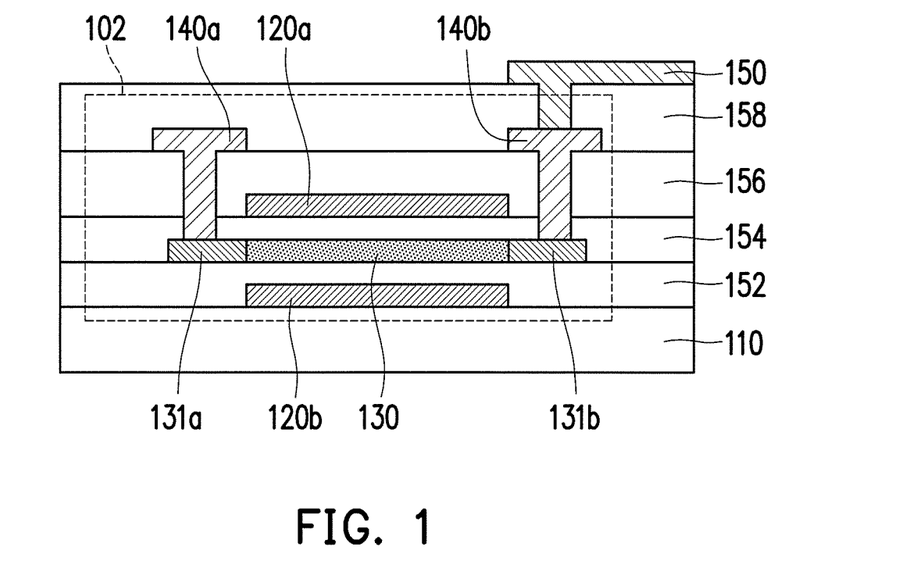
FIG. 1 illustrates a sectional view of a display device according to an embodiment of the invention.
Figure 2:
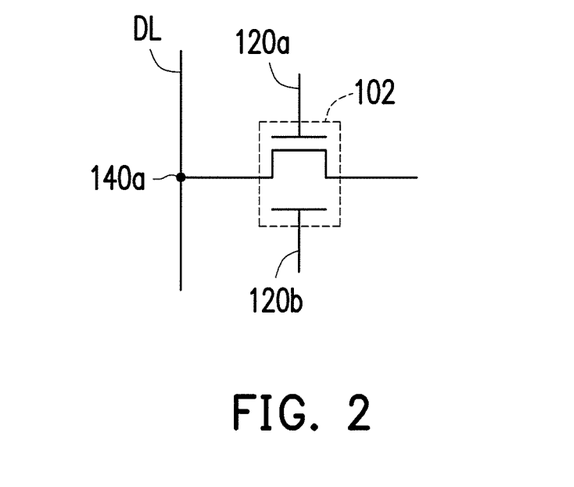
FIG. 2 illustrates an equivalent circuit of the display device depicted in FIG. 1 according to an embodiment of the invention.

FIG. 1 illustrates a sectional view of a display device according to an embodiment of the invention. FIG. 2 illustrates an equivalent circuit of the display device depicted in FIG. 1 according to an embodiment of the invention. Referring to FIG. 1 and FIG. 2, the double gate thin film transistor (TFT) structure 102 in the embodiment includes a first gate electrode 120a, a second gate electrode 120b, an active layer 130, a first contact layer 131a, a second contact layer 131b, a first data electrode 140a, and a second electrode 140b. The first gate electrode 120a is disposed on a substrate 110. The second gate electrode 120b is disposed between the first electrode 120a and the substrate 110. The second gate electrode 120b serves as a light shield for the double gate TFT structure 102 preventing light induced leak current of active layer 130. The second gate electrode 120b is between a light source and the active layer 130. The thickness of the first gate electrode 120a is greater than the second gate electrode 120b. One of the first gate electrode 120a and the second gate electrode 120b serves as main gate and connects to a scan line SL. The other one of the first gate electrode 120a and the second gate electrode 120b serves as sub gate. The active layer 130 is disposed between the first gate electrode 120a and the second gate electrode 120b. The active layer 130 is overlapped with the first gate electrode 120a and the second gate electrode 120b. Voltages are applied into the first gate electrode 120a and the second gate electrode 120b to control the channel of the active layer 130 for turning on or turning off of the TFT. The first contact layer 131a and the second contact layer 131b is active layer 130 with positive doped (P+) or active layer 130 negative doped (N+) for contact enhancement between semiconductor and electrode material (metal of metal oxide). The first data electrode 140a and the second data electrode 140b are disposed on the substrate 110 and electrically connected to the active layer 130 from opposite sides through the first contact layer 131a and the second contact layer 131b. The first data electrode 140a and the second data electrode 140b are served as source electrode and drain electrode of thin film transistor. In the embodiment, one of the first data electrode 140a and the second data electrode 140b is electrically connected to a data line DL. In the embodiment, the first data electrode 140a is electrically connected to the data line DL. The thin film transistor could be NMOS type or PMOS type. The double gate TFT structure 102 includes other adaptive functional layers such as conductive pixel electrode 150, and insulating layers 152, 154, 156, and 158. Nevertheless, it should be noted that the invention is not intended to limit the structure or form of the double gate TFT structure 102.

In the embodiment, the data electrode 140a is connected to a data line DL of a display panel as illustrated in FIG. 2, and first data electrode 140a may be deemed as a part of the data line DL. In the embodiment, a material of the active layer 130 may include amorphous silicon, poly silicon, or the indium gallium zinc oxide (IGZO), and the invention is not limited thereto. In the embodiment, a material of first gate electrode 120a, second gate electrode 120b, first data electrode 140a, and second data electrode 140b may include Al, Mg, Mo, Cu, Ag, Ti, In, Cr, or other metals, and the invention is not limited thereto. The material of insulating layers 152, 154 and 156 includes silicon oxide, silicon nitride, or aluminium oxide, and the invention is not limited thereto.

Figure 3:
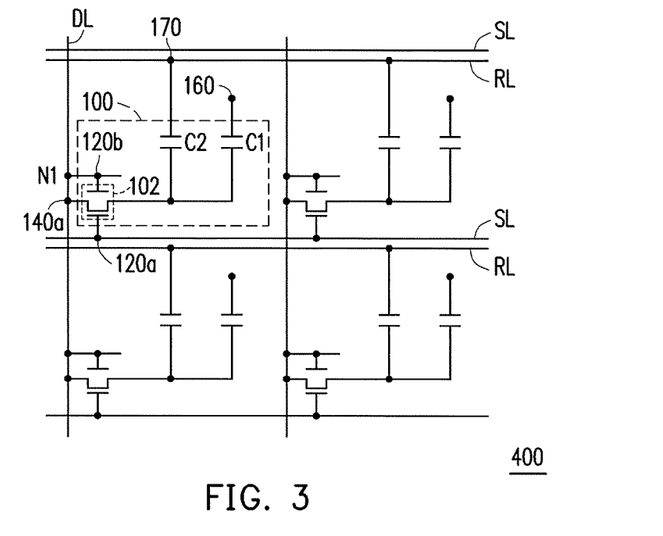
FIG. 3 illustrates a schematic diagram of a display panel according to an embodiment of the invention.

FIG. 3 illustrates a schematic diagram of a display panel according to an embodiment of the invention. Referring to FIG. 1 to FIG. 3, the display panel 400 of the embodiment includes a plurality of scan lines SL, a plurality of data lines DL, a plurality of reference line RL, and the plurality of display units 100. The display units 100 locate within intersections of the scan lines SL, the data lines DL, and the reference line RL. In the embodiment, the second gate electrode 120b is electrically connected to the data line DL through the first data electrode 140a at a node N1. The first gate electrode 120a is electrically connected to the scan line SL and electrically isolated to the second gate electrode 120b and the first data electrode 140a. In the embodiment, the second gate electrode 120b is electrically connected with the data line DL to keep the optimal voltage of the second gate electrode 120b. The off leak current of the display devices 100 is thus reduced by automatically applying the optimal voltage to the second gate electrode 120b via the data line DL.

In the embodiment, a top gate of TFT structure 102 is exemplarily disclosed for description, and the second gate electrode 120b, i.e. the bottom gate, is connected with the data line DL. Nevertheless, the invention is not limited thereto. For a bottom gate of TFT structure, the first gate electrode 120a, i.e. the top gate, may be connected with the data line DL to receive the optimal voltage, such that the off leak current of the display units 100 is also reduced. In other words, one of the first gate electrode 120a and the second gate electrode 120b is connected to the first data electrode 140a and data line DL in the embodiments of the invention.

In the embodiment, the display units 100 further includes a first capacitor C1 and a second capacitor C2 as illustrated in FIG. 3. The first capacitor C1 is a pixel capacitor. The first terminal of the first capacitor C1 is connected to the active layer 130 through the pixel electrode 150, second data electrode 140b, and second contact layer 131b. The second terminal of the first capacitor C1 is connected to a common voltage source through a first reference electrode 160. The second capacitor C2 is a storage capacitor. The third terminal of the second capacitor C2 is connected to the active layer 130 through pixel electrode 150, second data electrode 140b, and second contact layer 131b. The fourth terminal of the second capacitor C2 is connected to the reference line RL through a second reference electrode 170. In the embodiment, the reference line RL could be the common voltage source or the voltage of reference line RL is difference to common voltage. Nevertheless, it should be noted that the invention is not intended to limit the voltage or signal applied to the first reference electrode 160 (second terminal) and the second reference electrode 170 (fourth terminal). In an embodiment, one of the first reference electrode 160 and the second reference electrode 170 are electrically connected to the reference line RL. In other embodiment, the first reference electrode 160 and the second reference electrode 170 both electrically connect to the reference line RL.

Figure 4:
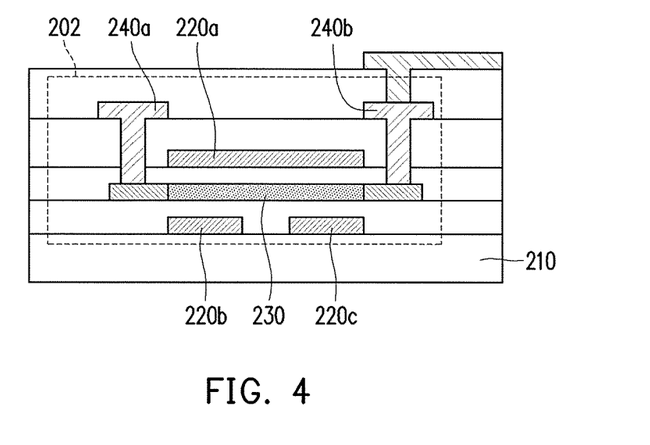
FIG. 4 illustrates a sectional view of a display device according to another embodiment of the invention.
Figure 5:
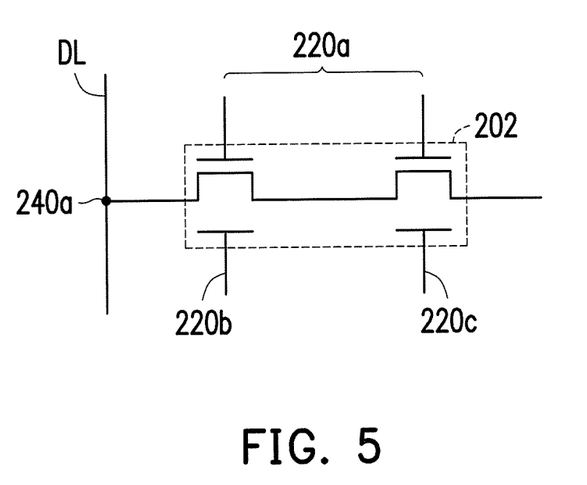
FIG. 5 illustrates an equivalent circuit of the display device depicted in FIG. 4 according to an embodiment of the invention.

FIG. 4 illustrates a sectional view of a display device according to another embodiment of the invention. FIG. 5 illustrates an equivalent circuit of the display device depicted in FIG. 4 according to an embodiment of the invention. Referring to FIG. 4 and FIG. 5, the display device of the embodiment includes two equivalent double gate TFT structures 202. The display device of the embodiment is similar to the display device depicted in FIG. 1, and a main difference therebetween, for example, lies in double gate TFT structures 202 of that the display device further includes a third gate electrode 220c. In the embodiment, the third gate electrode 220c is disposed between the first gate electrode 220a and the substrate 210, and the third gate electrode 220c is overlapped with the first gate electrode 220a and the active layer 230. The TFT structure described in this embodiment is sufficiently taught, suggested, and embodied in the embodiments illustrated in FIG. 1 to FIG. 2, and therefore no further description is provided herein.

Figure 6:
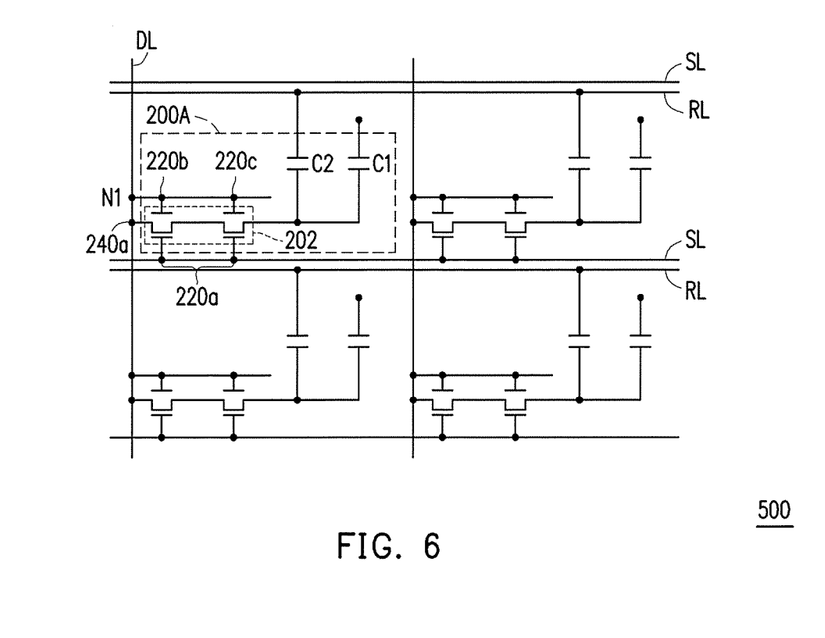
FIG. 6 illustrates a schematic diagram of a display panel according to another embodiment of the invention.

FIG. 6 illustrates a schematic diagram of a display panel according to the embodiment of the invention. Referring to FIG. 4 to FIG. 6, the display panel 500 of the embodiment includes a plurality of scan lines SL, a plurality of data lines DL, a plurality of reference line RL, and the plurality of display units 200A. The sectional view of the display units 200A is similar to that of the display device 200 depicted in FIG. 4, but the invention is not limited thereto. In the embodiment, the second gate electrode 220b is electrically connected to the data line DL through the first data electrode 240a at the node N1. The third gate electrode 220c is electrically connected to the second gate electrode 220b. The first gate electrode 220a is electrically connected to the scan line SL and electrically isolated to the second gate electrode 220b, the third gate electrode 220c and the first data electrode 240a. In the embodiment, the off leak current of the display unit 200A is thus reduced by automatically applying the optimal voltage to the second gate electrode 220b and the third gate electrode 220c via the data line DL. In addition, the circuit operation described in this embodiment is sufficiently taught, suggested, and embodied in the embodiments illustrated in FIG. 3, and therefore no further description is provided herein.

Figure 7:
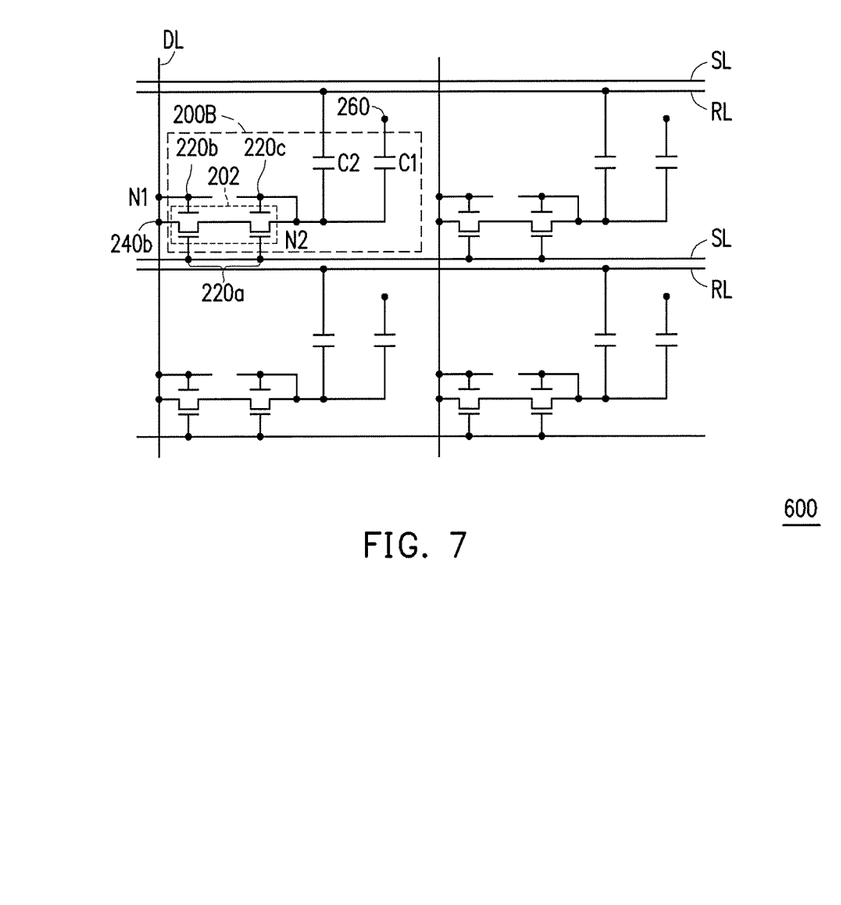
FIG. 7 illustrates a schematic diagram of a display panel according to another embodiment of the invention.

FIG. 7 illustrates a schematic diagram of a display panel according to another embodiment of the invention. Referring to FIG. 4 to FIG. 5 and FIG. 7, the display panel 600 of the embodiment includes a plurality of scan lines SL, a plurality of data lines DL, a plurality of reference line RL, and the plurality of display units 200B. The sectional view of the display units 200B is similar to that of the display device 200 depicted in FIG. 4, but the invention is not limited thereto. In the embodiment, the second gate electrode 220b is connected to the data line DL through the first data electrode 240a, i.e. the data line DL, at the node N1. The third gate electrode 220c is not electrically connected to the second gate electrode 220b, and is connected to the active layer 230 through the second data electrode 240b at a node N2. The first gate electrode 220a is connected to the scan line SL and electrically isolated to the second gate electrode 220b, the third gate electrode 220c and the data electrode 240a. In the embodiment, the off leak current of the display units 200B is thus reduced by automatically applying the optimal voltage to the second gate electrode 220b via the data line DL and to the third gate electrode 220c via the first capacitor C1 or the second capacitor C2. In addition, the circuit operation described in this embodiment is sufficiently taught, suggested, and embodied in the embodiments illustrated in FIG. 3, and therefore no further description is provided herein.

Figure 8:
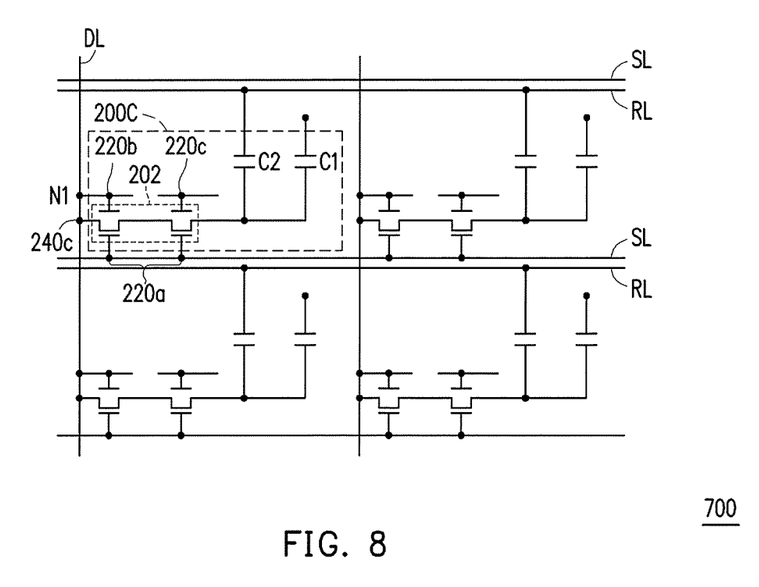
FIG. 8 illustrates a schematic diagram of a display panel according to another embodiment of the invention.

FIG. 8 illustrates a schematic diagram of a display panel according to another embodiment of the invention. Referring to FIG. 4 to FIG. 5 and FIG. 8, the display panel 700 of the embodiment includes a plurality of scan lines SL, a plurality of data lines DL, a plurality of reference line RL, and the plurality of display units 200C. The sectional view of the display units 200C is similar to that of the display device 200 depicted in FIG. 4, but the invention is not limited thereto. In the embodiment, the second gate electrode 220b is connected to the data line DL through the first data electrode 240a at the node N1. The third gate electrode 220c is electrically isolated to the first gate electrode 220a, the second gate electrode 220b, and the first data electrode 240a. In other words, the third gate electrode 220c is electrically floating in the embodiment. The first gate electrode 220a is connected to the scan line SL and electrically isolated to the second gate electrode 220b, the third gate electrode 220c and the first data electrode 240a. In the embodiment, the off leak current of the display units 200C is thus reduced by automatically applying the optimal voltage to the second gate electrode 220b via the data line DL. In addition, the circuit operation described in this embodiment is sufficiently taught, suggested, and embodied in the embodiments illustrated in FIG. 3, and therefore no further description is provided herein.

Figure 9:
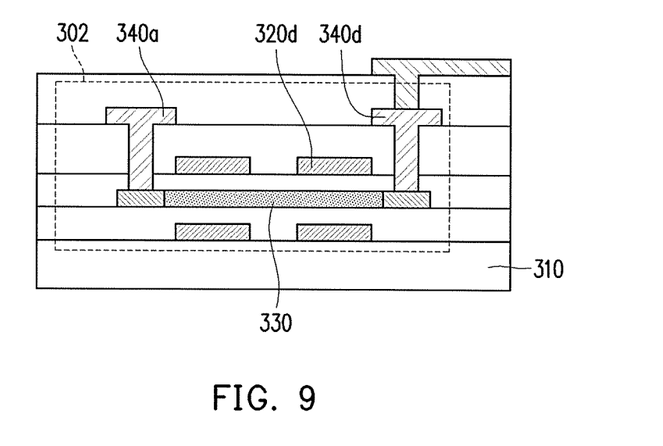
FIG. 9 illustrates a sectional view of a display device according to another embodiment of the invention.
Figure 10:
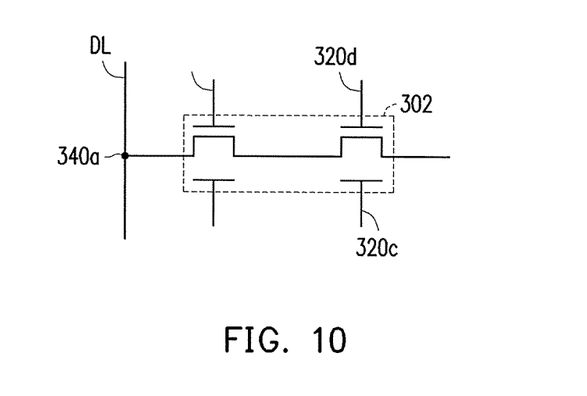
FIG. 10 illustrates an equivalent circuit of the display device depicted in FIG. 9 according to an embodiment of the invention.

FIG. 9 illustrates a sectional view of a display device according to another embodiment of the invention. FIG. 10 illustrates an equivalent circuit of the display device depicted in FIG. 9 according to an embodiment of the invention. Referring to FIG. 9 and FIG. 10, the display device 300 of the embodiment includes two equivalent double gate TFT structures 302. The display device 300 of the embodiment is similar to the display device 200 depicted in FIG. 4, and a main difference therebetween, for example, lies in that the display device 300 further includes a fourth gate electrode 320d. In the embodiment, the third gate electrode 320c is disposed between the fourth gate electrode 320d and the substrate 310, and the third gate electrode 320c is overlapped with the fourth gate electrode 320d and the active layer 330. The TFT structure 302 described in this embodiment is sufficiently taught, suggested, and embodied in the embodiments illustrated in FIG. 1 to FIG. 2 and FIG. 4 to FIG. 5, and therefore no further description is provided herein.

In addition, the TFT structures of the display units 200A, 200B and 200C respectively disclosed in FIG. 6 to FIG. 8 may be implemented as that of the display device 300. Nevertheless, it should be noted that the invention is not intended to limit the structures or forms of the display units 200A, 200B and 200C.

In summary, in the embodiments of the invention, the display device includes double gate electrodes. One of the first gate electrode and the second gate electrode is connected to the data line, so as to reduce the off leak current. In addition, for two equivalent double gate TFT structures, the third gate electrode is connected to the second gate electrode. In this case, the off leak current is also reduced automatically applying the optimal voltage to the second gate electrode.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A display device, comprising:
   a substrate;
   a first gate electrode disposed on the substrate;
   a second gate electrode disposed between the first gate electrode and the substrate;
   an active layer disposed between the first gate electrode and the second gate electrode, the active layer overlapped with the first gate electrode and the second gate electrode; and
   a first data electrode disposed on the substrate and connected to the active layer,
   wherein the second gate electrode is electrically connected to the first data electrode, and the first gate electrode is electrically isolated to the second gate electrode and the first data electrode.

2. The display device as claimed in claim 1, further comprising a third gate electrode disposed between the first gate electrode and the substrate, wherein the third gate electrode is overlapped with the first gate electrode and the active layer.

3. The display device as claimed in claim 2, wherein the third gate electrode is electrically connected to the second gate electrode.

4. The display device as claimed in claim 2, wherein the third gate electrode is electrically isolated to the first gate electrode, the second gate electrode, and the first data electrode.

5. The display device as claimed in claim 2, wherein the third gate electrode is electrically connected to the active layer through a second data electrode opposite to the first data electrode.

6. The display device as claimed in claim 1, further comprising a first capacitor, wherein a first terminal of the first capacitor is connected to the active layer, and a second terminal of the first capacitor is connected to a first reference electrode.

7. The display device as claimed in claim 6, further comprising a second capacitor, wherein a third terminal of the second capacitor is connected to the active layer, and a fourth terminal of the second capacitor is connected to a second reference electrode.

8. The display device as claimed in claim 7, wherein the first reference electrode is connected to the second reference electrode.

9. The display device as claimed in claim 1, wherein material of the active layer includes amorphous silicon, poly silicon, or indium gallium zinc oxide.

* * * * *